United States Patent
Takao et al.

(10) Patent No.: US 9,793,824 B2
(45) Date of Patent: Oct. 17, 2017

(54) GATE DRIVING CIRCUIT, SEMICONDUCTOR DEVICE, AND POWER CONVERSION DEVICE

(71) Applicant: Kabushiki Kaisha Toshiba, Minato-ku (JP)

(72) Inventors: Kazuto Takao, Tsukuba (JP); Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 40 days.

(21) Appl. No.: 14/797,329

(22) Filed: Jul. 13, 2015

(65) Prior Publication Data

US 2016/0072405 A1 Mar. 10, 2016

(30) Foreign Application Priority Data

Sep. 5, 2014 (JP) .................................. 2014-181654

(51) Int. Cl.
*H02M 3/315* (2006.01)
*H02M 7/537* (2006.01)
(Continued)

(52) U.S. Cl.
CPC ........ *H02M 7/537* (2013.01); *H03K 17/0406* (2013.01); *H03K 17/04123* (2013.01);
(Continued)

(58) Field of Classification Search
CPC .................................................. H02M 3/315
(Continued)

(56) References Cited

U.S. PATENT DOCUMENTS 6,861,828 B2 * 3/2005 Watanabe ............... H02M 3/00
323/282
7,298,123 B2 * 11/2007 Watanabe ........... H01L 29/7787
257/E29.253

(Continued)

FOREIGN PATENT DOCUMENTS

| JP | 9-93116 A | 4/1997 |
|---|---|---|
| JP | 2003-319638 A | 11/2003 |

(Continued)

OTHER PUBLICATIONS

Extended European Search Report dated Jan. 28, 2016 in Patent Application No. 15173422.5.

*Primary Examiner* — Adolf Berhane
*Assistant Examiner* — Nusrat Quddus
(74) *Attorney, Agent, or Firm* — Oblon, McClelland, Maier & Neustadt, L.L.P.

(57) ABSTRACT

A gate driving circuit of embodiments is provided with a first transistor which controls a gate-on voltage applied to a gate electrode of a switching device, a second transistor which controls a gate-off voltage applied to the gate electrode of the switching device, a driving logic circuit which controls turn-on/turn-off of the first and second transistors, a first power source which supplies the gate-on voltage to the gate electrode when the first transistor is turned on, a second power source which supplies the gate-off voltage to the gate electrode when the second transistor is turned on, a first gate resistance variable circuit in which a plurality of field effect transistors is connected in parallel, a second gate resistance variable circuit in which a plurality of field effect transistors is connected in parallel, and a gate resistance control circuit which controls gate voltages of a plurality of field effect transistors.

18 Claims, 4 Drawing Sheets

(51) Int. Cl.
*H03K 17/04* (2006.01)
*H03K 17/0412* (2006.01)
*H03K 17/042* (2006.01)
*H03K 17/16* (2006.01)

(52) U.S. Cl.
CPC ..... *H03K 17/04206* (2013.01); *H03K 17/164* (2013.01); *H03K 17/166* (2013.01); *H03K 17/168* (2013.01); *H03K 2217/0036* (2013.01)

(58) Field of Classification Search
USPC .............................. 363/55, 95–98, 131–132
See application file for complete search history.

(56) References Cited

U.S. PATENT DOCUMENTS

| | | | | |
|---|---|---|---|---|
| 8,102,687 | B2* | 1/2012 | Takasu | H02M 3/1582 363/132 |
| 8,299,820 | B2* | 10/2012 | Deboy | H03K 17/166 327/108 |
| 2003/0137352 | A1 | 7/2003 | Youn et al. | |
| 2004/0196678 | A1 | 10/2004 | Yoshimura et al. | |
| 2008/0122497 | A1 | 5/2008 | Ishikawa et al. | |
| 2010/0079191 | A1 | 4/2010 | Deboy | |
| 2012/0299624 | A1* | 11/2012 | Sugahara | H03K 17/168 327/109 |
| 2013/0009671 | A1* | 1/2013 | Suzuki | H03K 17/167 327/108 |
| 2013/0320826 | A1* | 12/2013 | Ikemoto | B61C 17/00 312/236 |
| 2014/0334214 | A1 | 11/2014 | Katoh et al. | |
| 2015/0002208 | A1 | 1/2015 | Sugahara | |
| 2015/0137872 | A1 | 5/2015 | Sugahara | |
| 2015/0318847 | A1 | 11/2015 | Sugahara | |

FOREIGN PATENT DOCUMENTS

| | | |
|---|---|---|
| JP | 2004-312817 A | 11/2004 |
| JP | 2008-78816 | 4/2008 |
| JP | 2008-92663 | 4/2008 |
| JP | 2009-303340 | 12/2009 |
| JP | 2012-157168 | 8/2012 |
| JP | 2012-253974 | 12/2012 |
| JP | 2013-110878 | 6/2013 |
| JP | 2014-130909 A | 7/2014 |

* cited by examiner

US 9,793,824 B2

GATE DRIVING CIRCUIT, SEMICONDUCTOR DEVICE, AND POWER CONVERSION DEVICE

CROSS-REFERENCE TO RELATED APPLICATION

This application is based upon and claims the benefit of priority from Japanese Patent Application No. 2014-181654, filed on Sep. 5, 2014, the entire contents of which are incorporated herein by reference.

FIELD

Embodiments described herein relate generally to a gate driving circuit, a semiconductor device, and a power conversion device.

BACKGROUND

In a power switching device such as a power metal oxide semiconductor field effect transistor (MOSFET) and a power insulated gate bipolar transistor (IGBT), switching loss might increase and erroneous ignition might occur unless gate resistance is made appropriate.

DETAILED DESCRIPTION

A gate driving circuit of embodiments is provided with a first transistor controlling on/off operation of a gate-on voltage applied to a gate electrode of a switching device; a second transistor controlling on/off operation of a gate-off voltage applied to the gate electrode of the switching device; a driving logic circuit controlling turn-on/turn-off of the first and second transistors; a first power source supplying the gate-on voltage to the gate electrode when the first transistor is turned on; a second power source supplying the gate-off voltage to the gate electrode when the second transistor is turned on; a first gate resistance variable circuit electrically connected between the first transistor and the gate electrode, the first gate resistance variable circuit including a plurality of field effect transistors connected in parallel; a second gate resistance variable circuit electrically connected between the second transistor and the gate electrode, the second gate resistance variable circuit including a plurality of field effect transistors connected in parallel; and a gate resistance control circuit controlling gate voltages of the plurality of field effect transistors of the first gate resistance variable circuit and gate voltages of the plurality of field effect transistors of the second gate resistance variable circuit.

Hereinafter, embodiments of the present disclosure are described with reference to the drawings. Meanwhile, in the following description, the same reference sign is assigned to the identical members and the like and the description of the member and the like described once is appropriately omitted.

First Embodiment

A gate driving circuit of this embodiment is provided with a first transistor which controls on/off operation of a gate-on voltage applied to a gate electrode of a switching device, a second transistor which controls on/off operation of a gate-off voltage applied to the gate electrode of the switching device, a driving logic circuit which controls turn-on/turn-off of the first and second transistors, a first power source which supplies the gate-on voltage to the gate electrode when the first transistor is turned on, a second power source which supplies the gate-off voltage to the gate electrode when the second transistor is turned on, a first gate resistance variable circuit electrically connected between the first transistor and the gate electrode in which a plurality of field effect transistors is connected in parallel, a second gate resistance variable circuit electrically connected between the second transistor and the gate electrode in which a plurality of field effect transistors is connected in parallel, and a gate resistance control circuit which controls gate voltages of a plurality of field effect transistors of the first gate resistance variable circuit and gate voltages of a plurality of field effect transistors of the second gate resistance variable circuit.

Figure 1:
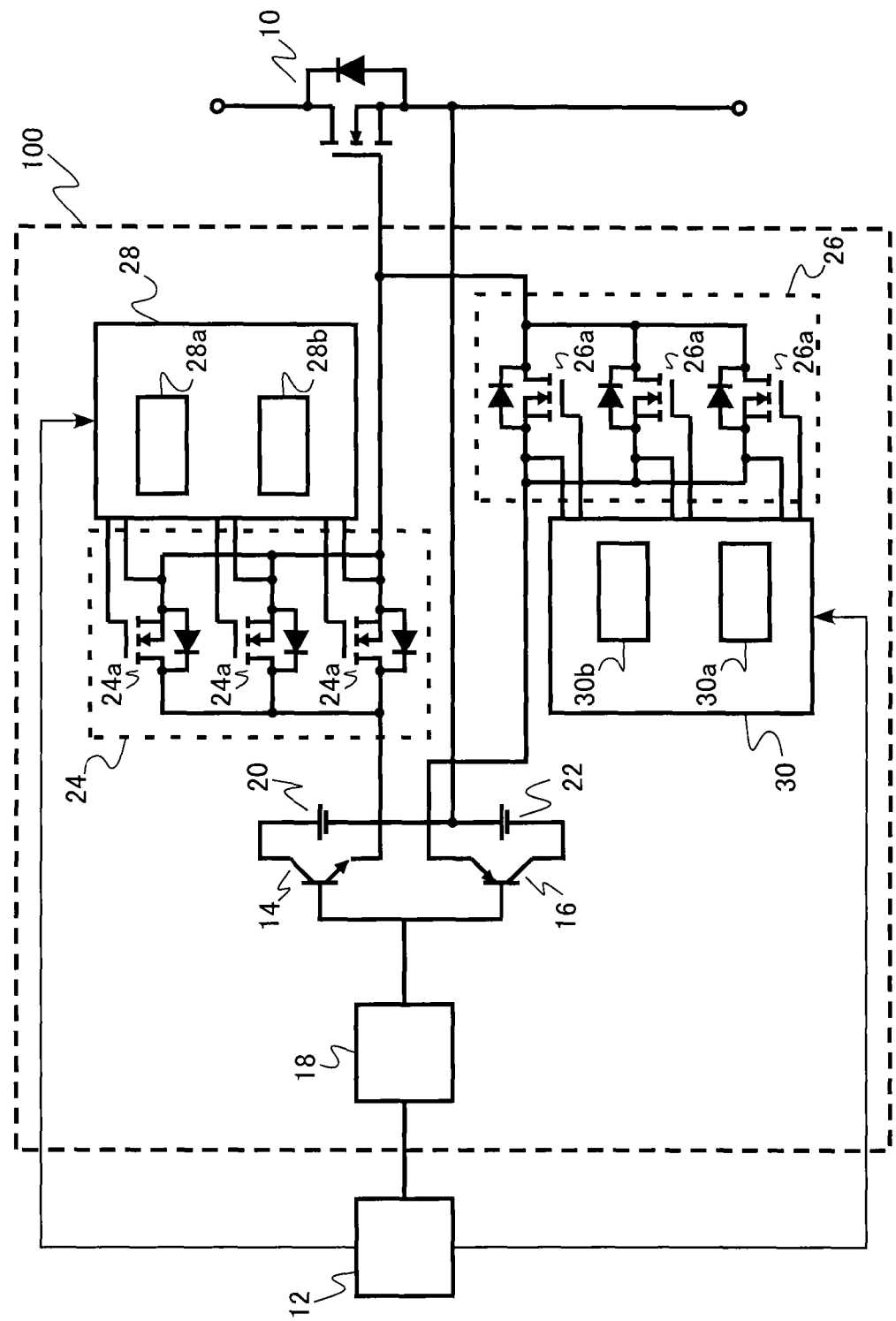
FIG. 1 is a circuit diagram of a gate driving circuit of a first embodiment.

FIG. 1 is a circuit diagram of the gate driving circuit of this embodiment. A gate driving circuit 100 of this embodiment is a gate driving circuit which controls a gate voltage of a power switching device (hereinafter, also simply referred to as switching device) 10. The switching device 10 is an n-type MOSFET in which a wide gap semiconductor formed of silicon carbide (SiC) and the like is used, for example. The gate driving circuit 100 drives based on a control signal from a control signal circuit 12.

The gate driving circuit 100 is provided with a first transistor 14, a second transistor 16, a driving logic circuit 18, a first power source 20, a second power source 22, a first gate resistance variable circuit 24, a second gate resistance variable circuit 26, a first gate resistance control circuit 28, and a second gate resistance control circuit 30.

The first transistor 14 controls the on/off operation of the gate-on voltage applied to the gate electrode of the switching device 10. The first transistor 14 is an npn-type bipolar transistor, for example. It is also possible to apply the n-type MOSFET, for example, as the first transistor 14.

The second transistor 16 controls the on/off operation of the gate-off voltage applied to the gate electrode of the switching device 10. The second transistor 16 is a pnp-type bipolar transistor, for example. It is also possible to apply a p-type MOSFET, for example, as the second transistor 16.

The driving logic circuit 18 controls turn-on/turn-off of the first and second transistors 14 and 16. The driving logic circuit 18 acts as a buffer circuit which transmits the control signal (input signal) from the control signal circuit 12 as gate voltages of the first and second transistors 14 and 16, for example. The driving logic circuit 18 is provided with a photo coupler which electrically insulates the control signal circuit 12 from the switching device 10, for example.

The first power source 20 supplies the gate-on voltage to the gate electrode of the switching device 10 when the first transistor 14 is turned on. The first power source 20 is a power source circuit, for example. The second power source 22 supplies the gate-off voltage to the gate electrode of the switching device 10 when the second transistor 16 is turned on.

The first gate resistance variable circuit 24 is electrically connected between the first transistor 14 and the gate electrode of the switching device 10. Three field effect transistors 24a are connected in parallel in the first gate resistance variable circuit 24. The field effect transistor 24a is the MOSFET, for example. The number of the field effect transistors 24a may be two or four or more. The field effect transistors 24a desirably have different on-resistances.

The second gate resistance variable circuit 26 is electrically connected between the second transistor 16 and the gate electrode of the switching device 10. Three field effect transistors 26a are connected in parallel in the second gate resistance variable circuit 26. The field effect transistor 26a is the MOSFET, for example. The number of the field effect transistors 26a may be two or four or more. The field effect transistors 26a desirably have different on-resistances.

The first gate resistance control circuit 28 controls the gate voltages of a plurality of field effect transistors 24a. For example, the first gate resistance control circuit 28 controls the gate voltages of the field effect transistors 24a to be desired values independently.

The first gate resistance control circuit 28 is provided with a memory 28a and an arithmetic unit 28b. The memory 28a stores current voltage characteristics (IV characteristics), a gate threshold voltage, capacitance voltage characteristics (CV characteristics), and an internal gate resistance value of the switching device 10, and an allowable value of an overvoltage, for example. For example, the memory 28a also stores a value of the gate voltage applied to the field effect transistor 24a. The arithmetic unit 28b performs arithmetic operation of the gate voltages of a plurality of field effect transistors 24a based on information of the memory 28a.

The second gate resistance control circuit 30 controls the gate voltages of a plurality of field effect transistors 26a. For example, the second gate resistance control circuit 3 controls the gate voltages of the field effect transistors 26a to be desired values independently.

The second gate resistance control circuit 30 is provided with a memory 30a and an arithmetic unit 30b. The memory 30a stores the current voltage characteristics (IV characteristics), the gate threshold voltage, the capacitance voltage characteristics (CV characteristics), and the internal gate resistance value of the switching device 10, and the allowable value of the overvoltage, for example. For example, this also stores a value of the gate voltage applied to the field effect transistor 26a. The arithmetic unit 30b performs arithmetic operation of the gate voltages of a plurality of field effect transistors 26a based on information of the memory 30a.

Meanwhile, the first and second gate resistance control circuits 28 and 30 may also be an integrated circuit in place of independent circuits.

Next, a control method of this embodiment is described.

The gate driving circuit 100 of this embodiment controls on/off timing of the switching device 10 based on the control signal from the control signal circuit 12. When the control signal from the control signal circuit 12 is input to the driving logic circuit 18, a base current is supplied to base electrodes of the first and second transistors 14 and 16 such that the first transistor 14 is turned on and the second transistor 16 is turned off when the switching device 10 is put into an on-state. When the switching device 10 is put into an off-state, the base current is supplied to the base electrodes of the first and second transistors 14 and 16 such that the first transistor 14 is turned off and the second transistor 16 is turned on.

When the first transistor 14 is turned on, the gate-on voltage is supplied from the first power source 20 to the gate electrode of the switching device 10 and the switching device 10 is turned on. On the other hand, when the second transistor 16 is turned on, the gate-off voltage is supplied from the second power source 22 to the gate electrode of the switching device 10 and the switching device 10 is turned off.

The first gate resistance control circuit 28 controls the gate voltages of a plurality of field effect transistors 24a of the first gate resistance variable circuit 24 to be the desired values independently. This sets the on-resistances of a plurality of field effect transistors 24a to desired values by setting the gate voltages to the desired values. Gate resistance when the switching device 10 turns on is set to a value defined by combined resistance of the on-resistances of the field effect transistors 24a of the first gate resistance variable circuit 24.

The second gate resistance control circuit 30 controls the gate voltages of a plurality of field effect transistors 26a of the second gate resistance variable circuit 26 to be the desired values independently. This sets on-resistances of a plurality of field effect transistors 26a to desired values by setting the gate voltages to the desired values. The gate resistance when the switching device 10 turns off is set to a value defined by combined resistance of the on-resistances of the field effect transistors 26a of the second gate resistance variable circuit 26.

The gate resistance in the off-state of the switching device 10 is set to the value defined by the combined resistance of the on-resistances of the field effect transistors 26a of the second gate resistance variable circuit 26.

The first and second gate resistance control circuits 28 and 30 control the gate voltages of the field effect transistors 24a and 26a in synchronization with the control signal from the control signal circuit 12. For example, information such as on/off timing of the switching device 10 and a current command value is brought from the control signal circuit 12 to the first and second gate resistance control circuits 28 and 30 by the control signal.

The arithmetic unit 28b of the first gate resistance control circuit 28 calculates an optimal gate resistance condition capable of satisfying both reduction in switching loss and inhibition of the overvoltage from the information brought from the control signal circuit 12 and the characteristics information of the switching device 10 and the allowable value of the overvoltage stored in the memory 28a. Furthermore, the arithmetic unit 28b calculates a gate voltage condition of each field effect transistor 24a which realizes the optimal gate resistance condition. The first gate resistance control circuit 28 controls such that the gate voltage of each field effect transistor 24a satisfies the calculated gate voltage condition in synchronization with the on/off timing of the switching device 10.

Similarly, the arithmetic unit 30b of the second gate resistance control circuit 30 calculates the optimal gate resistance condition capable of satisfying both the reduction in the switching loss and the inhibition of the overvoltage from the information brought from the control signal circuit 12 and the characteristics information of the switching device 10 and the allowable value of the overvoltage stored in the memory 30a. This also calculates the optimal gate resistance condition for inhibiting erroneous ignition during off time. Furthermore, the arithmetic unit 30b calculates the gate voltage condition of each field effect transistor 26a which realizes the optimal gate resistance condition. The second gate resistance control circuit 30 controls such that the gate voltage of each field effect transistor 26a satisfies the calculated gate voltage condition in synchronization with the on/off timing of the switching device 10.

Meanwhile, the calculation of the gate voltage condition by the arithmetic units 28b and 30b is executed in real time for the operation of the switching device 10 to be fed back, for example. For example, it is also possible to calculate the gate voltage condition in advance prior to the operation of the switching device 10 and feed back when the switching device 10 operates.

A function and an effect of this embodiment are hereinafter described.

For example, in a power semiconductor module such as a voltage type power conversion module, device breakdown by the overvoltage at the time of turnoff becomes problematic as switching operation of the switching device becomes faster. The overvoltage at the time of turnoff is proportional to wiring inductance and a time change rate of the current (di/dt) flowing through the module. If switching time is made longer for inhibiting the overvoltage, the switching operation becomes slower. At the same time, the switching loss proportional to a product of the current and the switching time (it) becomes larger. In this manner, the reduction in the switching loss and the inhibition of the overvoltage generated by noise at the time of the switching are in a trade off relationship.

It is possible to control the switching loss and the overvoltage by changing magnitude of the gate resistance of the switching device 10. For example, when the gate resistance of the switching device 10 is made higher, the switching time of the switching device 10 becomes longer and the switching loss becomes larger. However, when the gate resistance is high, the noise decreases, so that the generation of the overvoltage is inhibited. On the other hand, when the gate resistance of the switching device 10 is made low, the switching time of the switching device 10 becomes shorter and the switching loss becomes smaller. However, the generation of the overvoltage is promoted due to increased noise.

In case the gate resistance when the switching device 10 is turned off is high, the gate voltage of the switching device 10 may unintentionally increases. The increase in the gate voltage turns on the switching device 10 and problem of the erroneous ignition occurs. It is possible to control the erroneous ignition by changing the magnitude of the gate resistance of the switching device 10.

In this embodiment, it becomes possible to realize appropriate gate resistance for reducing the switching loss, inhibiting the overvoltage, and preventing the erroneous ignition by making the gate resistance of the switching device 10 variable.

In this embodiment, it becomes possible to widen a variable range (dynamic range) of the gate resistance by connecting a plurality of field effect transistors 24a in parallel and connecting a plurality of field effect transistors 26a in parallel. Therefore, it becomes easy to realize the appropriate gate resistance.

In this embodiment, it becomes possible to set the gate resistance when the switching device 10 is turned on and in the on-state thereof to a desired value by changing the combined resistance of the on-resistances of the field effect transistors 24a. It becomes possible to set the gate resistance when the switching device 10 is turned off and in the off-state thereof to the desired value by changing the combined resistance of the on-resistances of the field effect transistors 26a.

For example, when the current allowed to flow through the switching device 10 is relatively large, the combined resistance of the field effect transistors 26a of the second gate resistance variable circuit 26 is made high when the switching device 10 is turned off. Then, the switching speed is made lower. According to this, it is possible to inhibit the overvoltage at the time of the turn off.

When the current allowed to flow through the switching device 10 is relatively small, the combined resistance of the field effect transistors 24a of the first gate resistance variable circuit 24 and that of the field effect transistors 26a of the second gate resistance variable circuit 26 are made low when the switching device 10 is turned on and turned off. Then, the switching speed is made higher. According to this, the switching loss may be reduced.

When the switching device 10 is off state, the combined resistance of the field effect transistors 26a of the second gate resistance variable circuit 26 is decreased to a limit to cause short-circuit between the gate electrode and a source electrode of the switching device 10. According to this, it becomes possible to prevent the erroneous ignition.

In this embodiment, the first and second gate resistance control circuits 28 and 30 control the gate voltages of a plurality of field effect transistors 24a and 26a in synchronization with the control signal which controls on/off timing of the switching device 10. Therefore, it becomes possible to change the gate resistance with time according to an operation condition of the switching device 10, thereby realizing the appropriate gate resistance for reducing the switching loss, inhibiting the overvoltage, and preventing the erroneous ignition.

A plurality of field effect transistors 24a and 26a desirably have different on-resistances. It becomes possible to further widen the variable range of the gate resistance by the different on-resistances provided. Therefore, it becomes possible to realize more appropriate gate resistance. For example, it is possible to change the variable ranges of the on-resistances of three field effect transistors 24a or three field effect transistors 26a by digit.

As described above, according to this embodiment, it becomes possible to provide the gate driving circuit capable of making the gate resistance of the switching device appropriate.

Second Embodiment

A gate driving circuit of this embodiment is similar to that of a first embodiment except that a gate resistance control circuit is not synchronized with a control signal which controls on/off timing of a switching device. Therefore, the description of the contents overlapped with those of the first embodiment is not repeated.

Figure 2:
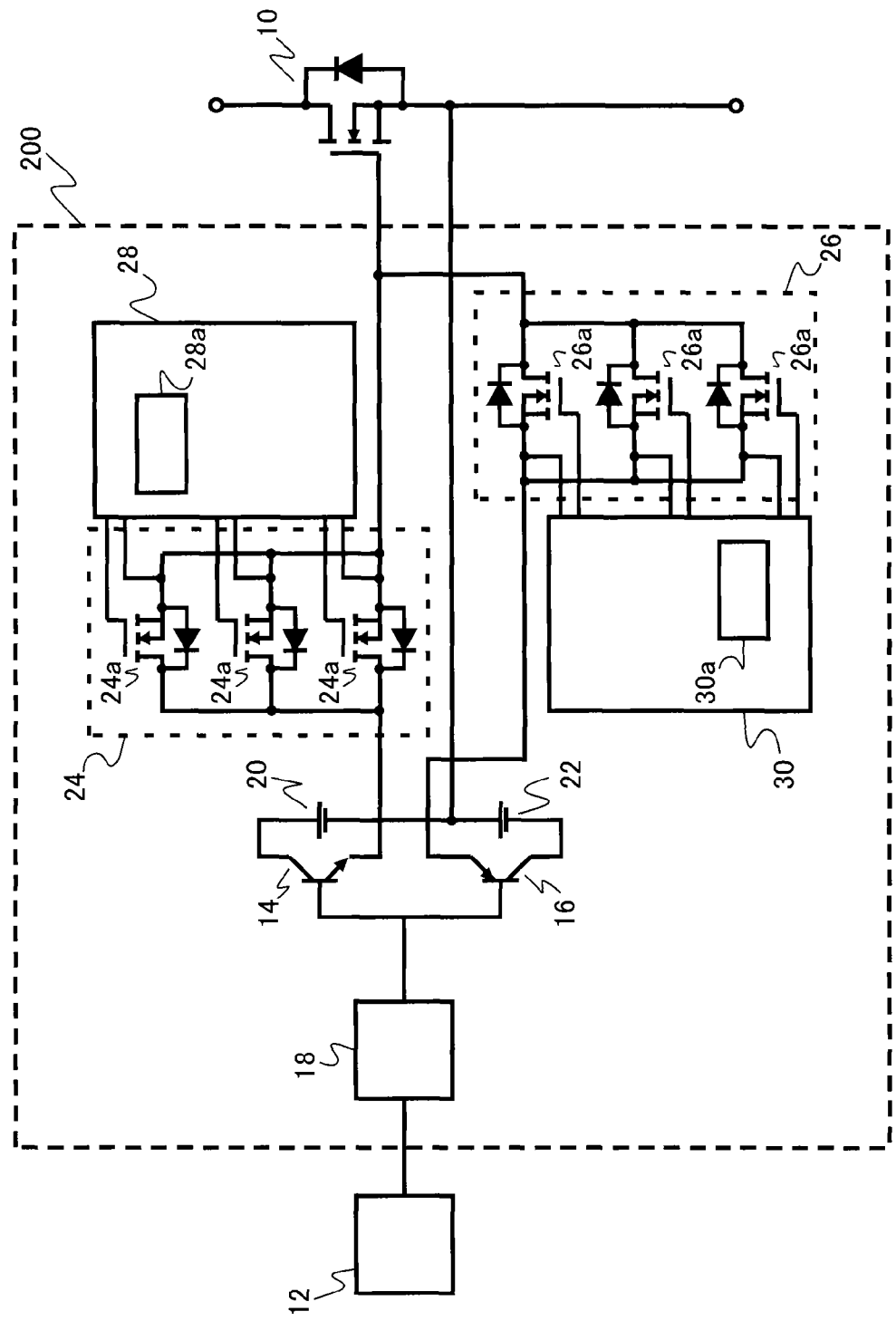
FIG. 2 is a circuit diagram of a gate driving circuit of a second embodiment.

FIG. 2 is a circuit diagram of the gate driving circuit of this embodiment. In a gate driving circuit 200, first and second gate resistance control circuits 28 and 30 are not synchronized with the control signal emitted from a control signal circuit 12 which controls on/off timing of a switching device 10.

The first and second gate resistance control circuits 28 and 30 control gate voltages of field effect transistors 24a and 26a to predetermined values in order to realize predetermined gate resistance determined based on circuit operation and circuit simulation, in advance, for example. The gate voltages of the field effect transistors 24a and 26a are fixed values which do not change during operation of the switching device 10, for example.

For example, it is configured to control first and second gate resistance variable circuits 24 and 26 by externally inputting the predetermined values of the gate voltages of the field effect transistors 24a and 26a to store in memories 28a and 30a of the first and second gate resistance control circuits 28 and 30.

According to the gate driving circuit of this embodiment, it is possible to change easily to appropriate gate resistance for reducing switching loss, inhibiting overvoltage, and preventing erroneous ignition even after the gate driving circuit 200 is embedded in a semiconductor module, for example.

Third Embodiment

A semiconductor device of this embodiment is provided with a switching device, and a gate driving circuit including a first transistor which controls on/off operation of a gate-on voltage applied to a gate electrode of the switching device, a second transistor which controls on/off operation of a gate-off voltage applied to the gate electrode of the switching device, a driving logic circuit which controls turn-on/turn-off of the first and second transistors, a first power source which supplies the gate-on voltage to the gate electrode when the first transistor is turned on, a second power source which supplies the gate-off voltage to the gate electrode when the second transistor is turned on, a first gate resistance variable circuit electrically connected between the first transistor and the gate electrode in which a plurality of field effect transistors is connected in parallel, a second gate resistance variable circuit electrically connected between the second transistor and the gate electrode in which a plurality of field effect transistors is connected in parallel, and a gate resistance control circuit which controls gate voltages of a plurality of field effect transistors of the first gate resistance variable circuit and gate voltages of a plurality of field effect transistors of the second gate resistance variable circuit.

The semiconductor device of this embodiment is provided with the switching device and the gate driving circuit of a first embodiment. The description of the contents overlapped with those of the first embodiment is not repeated.

Figure 3:
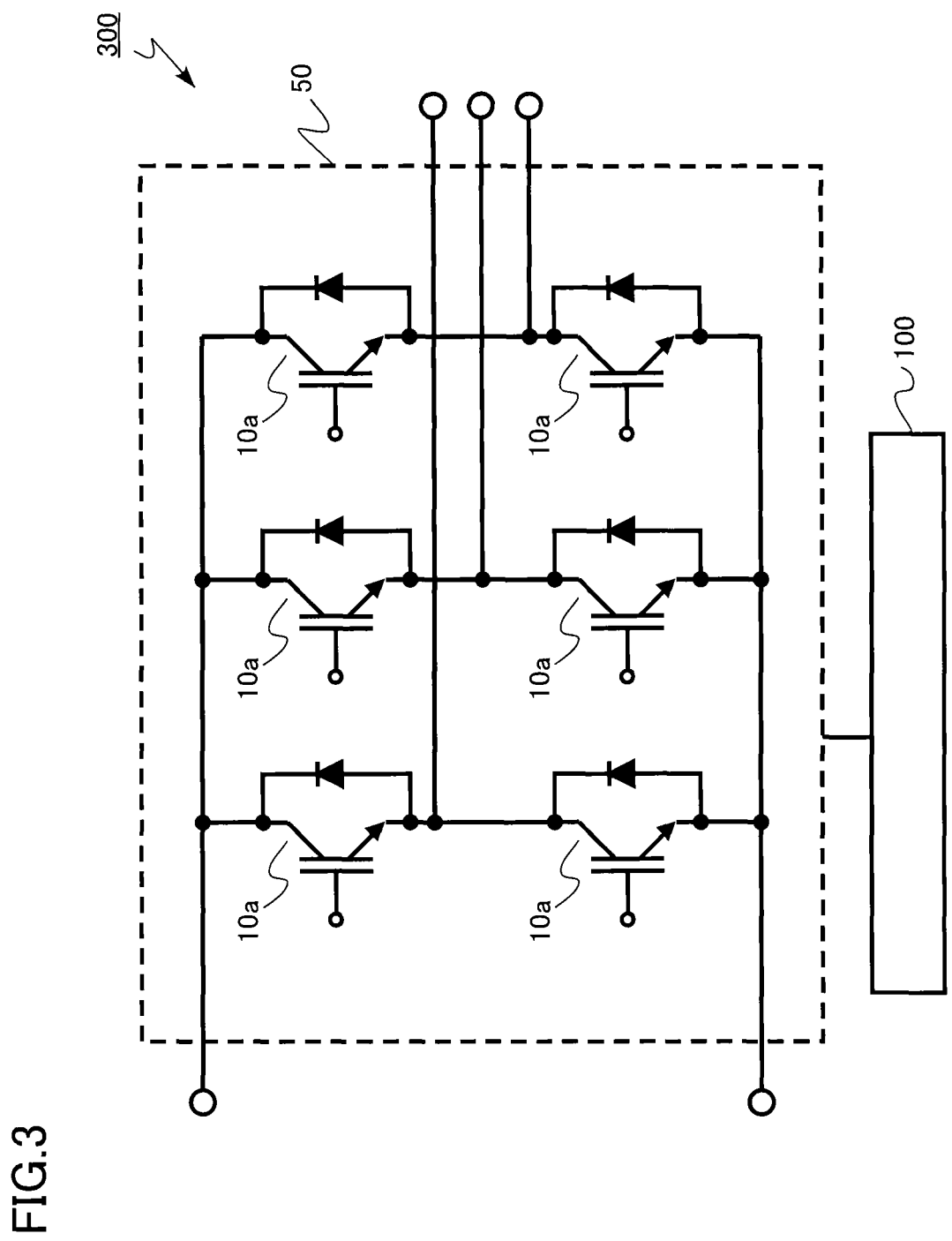
FIG. 3 is a block diagram of a semiconductor device of a third embodiment.

FIG. 3 is a block diagram of the semiconductor device of this embodiment. A semiconductor device 300 is an intelligent power module (IPM) provided with an inverter circuit 50 and a gate driving circuit 100.

The inverter circuit 50 is provided with six switching devices 10a. The switching device 10a is an n-type IGBT or MOSFET in which a wide gap semiconductor formed of SiC and the like is used, for example.

The gate driving circuit 100 is connected to a gate electrode of each of the six switching devices 10a to control the switching device 10a.

According to this embodiment, it becomes possible to provide the semiconductor device capable of making gate resistance of the switching device appropriate.

Fourth Embodiment

A power conversion device of this embodiment is provided with a switching device, a gate driving circuit including a first transistor which controls on/off operation of a gate-on voltage applied to a gate electrode of the switching device, a second transistor which controls on/off operation of a gate-off voltage applied to the gate electrode of the switching device, a driving logic circuit which controls turn-on/turn-off of the first and second transistors, a first power source which supplies the gate-on voltage to the gate electrode when the first transistor is turned on, a second power source which supplies the gate-off voltage to the gate electrode when the second transistor is turned on, a first gate resistance variable circuit electrically connected between the first transistor and the gate electrode in which a plurality of field effect transistors is connected in parallel, a second gate resistance variable circuit electrically connected between the second transistor and the gate electrode in which a plurality of field effect transistors is connected in parallel, and a gate resistance control circuit which controls gate voltages of a plurality of field effect transistors of the first gate resistance variable circuit and gate voltages of a plurality of field effect transistors of the second gate resistance variable circuit, a capacitor electrically connected to the switching device, and a radiating plate which radiates heat emitted from the switching device.

The power conversion device of this embodiment is provided with a semiconductor device of a third embodiment, the capacitor, and the radiating plate. The description of the contents overlapped with those of the first or third embodiment is not repeated.

Figure 4:
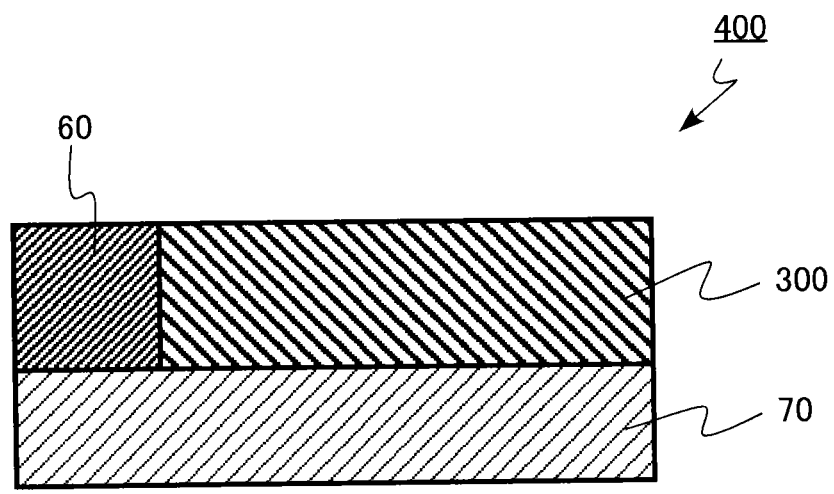
FIG. 4 is a schematic cross-sectional view of a power conversion device of a fourth embodiment.

FIG. 4 is a schematic cross-sectional view of the power conversion device of this embodiment. A power conversion device 400 is an inverter device including an IPM 300 including an inverter circuit and the gate driving circuit, a capacitor 60, and a radiating plate 70.

The capacitor 60 is a smoothing capacitor electrically connected to the switching device of the IPM 300, for example. The radiating plate 70 radiates the heat emitted from the switching device of the IPM 300. The radiating plate 70 may be formed of metal having high thermal conductivity such as aluminum, for example.

According to this embodiment, it becomes possible to provide the power conversion device capable of making gate resistance of the switching element appropriate.

Although the n-type MOSFET and n-type IGBT are described above as an example of the switching device in the embodiments, it is also possible to apply the p-type MOSFET and a p-type IGBT. It is also possible to apply a high electron mobility transistor (HEMT), a junction field effect transistor (JFET) and the like in addition to the MOSFET and IGBT.

Although silicon carbide (SiC) of a wide band gap semiconductor is described as an example of a semiconductor material of the switching device, it is also possible to apply silicon (Si), gallium nitride (GaN) and the like.

While certain embodiments have been described, these embodiments have been presented by way of example only, and are not intended to limit the scope of the inventions. Indeed, the gate driving circuit, the semiconductor device, and the power conversion device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A gate driving circuit comprising:
   a first transistor controlling on/off operation of a gate-on voltage applied to a gate electrode of a switching device;
   a second transistor controlling on/off operation of a gate-off voltage applied to the gate electrode of the switching device;
   a driving logic circuit controlling turn-on/turn-off of the first and second transistors;
   a first power source supplying the gate-on voltage to the gate electrode when the first transistor is turned on;

a second power source supplying the gate-off voltage to the gate electrode when the second transistor is turned on;

a first gate resistance variable circuit electrically connected between the first transistor and the gate electrode, the first gate resistance variable circuit including a plurality of field effect transistors connected in parallel;

a second gate resistance variable circuit electrically connected between the second transistor and the gate electrode, the second gate resistance variable circuit including a plurality of field effect transistors connected in parallel; and a gate resistance control circuit controlling gate voltages of the plurality of field effect transistors of the first gate resistance variable circuit and gate voltages of the plurality of field effect transistors of the second gate resistance variable circuit.

2. The circuit according to claim 1, wherein the gate resistance control circuit controls the gate voltages of the plurality of field effect transistors in synchronization with a control signal which controls on/off timing of the switching device.

3. The circuit according to claim 1, wherein the plurality of field effect transistors has different on-resistances.

4. The circuit according to claim 1, wherein the gate resistance control circuit includes a memory to store current voltage characteristics, a gate threshold voltage, capacitance voltage characteristics, and an internal gate resistance value of the switching device, and an allowable value of an overvoltage, and an arithmetic unit to perform arithmetic operation of the gate voltages of the plurality of field effect transistors based on information of the memory.

5. The circuit according to claim 1, wherein the switching device is a MOSFET or an IGBT in which a wide band gap semiconductor is used.

6. A semiconductor device comprising:
a switching device; and
a gate driving circuit including a first transistor controlling on/off operation of a gate-on voltage applied to a gate electrode of the switching device; a second transistor controlling on/off operation of a gate-off voltage applied to the gate electrode of the switching device; a driving logic circuit controlling turn-on/turn-off of the first and second transistors; a first power source supplying the gate-on voltage to the gate electrode when the first transistor is turned on; a second power source supplying the gate-off voltage to the gate electrode when the second transistor is turned on; a first gate resistance variable circuit electrically connected between the first transistor and the gate electrode, the first gate resistance variable circuit including a plurality of field effect transistors connected in parallel; a second gate resistance variable circuit electrically connected between the second transistor and the gate electrode, the second gate resistance variable circuit including a plurality of field effect transistors connected in parallel; and a gate resistance control circuit controlling gate voltages of the plurality of field effect transistors of the first gate resistance variable circuit and gate voltages of the plurality of field effect transistors of the second gate resistance variable circuit.

7. The device according to claim 6, wherein the gate resistance control circuit controls the gate voltages of the plurality of field effect transistors in synchronization with a control signal which controls on/off timing of the switching device.

8. The device according to claim 6, wherein the plurality of field effect transistors has different on-resistances.

9. The device according to claim 6, wherein the gate resistance control circuit includes a memory to store current voltage characteristics, a gate threshold voltage, capacitance voltage characteristics, and an internal gate resistance value of the switching device, and an allowable value of an overvoltage, and an arithmetic unit to perform arithmetic operation of the gate voltages of the plurality of field effect transistors based on information stored in the memory.

10. The device according to claim 6, wherein the switching device is a MOSFET or an IGBT in which a wide band gap semiconductor is used.

11. A power conversion device comprising:
a switching device;
a gate driving circuit including a first transistor controlling on/off operation of a gate-on voltage applied to a gate electrode of the switching device; a second transistor controlling on/off operation of a gate-off voltage applied to the gate electrode of the switching device; a driving logic circuit controlling turn-on/turn-off of the first and second transistors; a first power source supplying the gate-on voltage to the gate electrode when the first transistor is turned on; a second power source supplying the gate-off voltage to the gate electrode when the second transistor is turned on; a first gate resistance variable circuit electrically connected between the first transistor and the gate electrode, the first gate resistance variable circuit including a plurality of field effect transistors connected in parallel; a second gate resistance variable circuit electrically connected between the second transistor and the gate electrode, the second gate resistance variable circuit including a plurality of field effect transistors is connected in parallel; a gate resistance control circuit controlling gate voltages of the plurality of field effect transistors of the first gate resistance variable circuit and gate voltages of the plurality of field effect transistors of the second gate resistance variable circuit;

a capacitor electrically connected to the switching device; and a radiating plate radiating heat emitted from the switching device.

12. The device according to claim 11, wherein the gate resistance control circuit controls the gate voltages of the plurality of field effect transistors in synchronization with a control signal which controls on/off timing of the switching device.

13. The device according to claim 11, wherein the plurality of field effect transistors has different on-resistances.

14. The device according to claim 11, wherein the gate resistance control circuit includes a memory to store current voltage characteristics, a gate threshold voltage, capacitance voltage characteristics, and an internal gate resistance value of the switching device, and an allowable value of an overvoltage, and an arithmetic unit to perform arithmetic operation of gate voltages of the plurality of field effect transistors based on information of the memory.

15. The device according to claim 11, wherein the switching device is a MOSFET or an IGBT in which a wide band gap semiconductor is used.

16. The circuit according to claim 1,
wherein the plurality of field effect transistors included in the first gate resistance variable circuit are n-type first MOSFETs, each of a drain electrode of the first MOSFET is connected to the first transistor, and each of a source electrode of the first MOSFET is connected to the gate electrode of the switching device, and wherein the plurality of field effect transistors included in the second gate resistance variable circuit are n-type second MOSFETs, each of a source electrode of the second MOSFET is connected to the second transistor, and each of a drain electrode of the second MOSFET is connected to the gate electrode of the switching device.

17. The device according to claim 6, wherein the plurality of field effect transistors included in the first gate resistance variable circuit are n-type first MOSFETs, each of a drain electrode of the first MOSFET is connected to the first transistor, and each of a source electrode of the first MOSFET is connected to the gate electrode of the switching device, and wherein the plurality of field effect transistors included in the second gate resistance variable circuit are n-type second MOSFETs, each of a source electrode of the second MOSFET is connected to the second transistor, and each of a drain electrode of the second MOSFET is connected to the gate electrode of the switching device.

18. The device according to claim 11, wherein the plurality of field effect transistors included in the first gate resistance variable circuit are n-type first MOSFETs, each of a drain electrode of the first MOSFET is connected to the first transistor, and each of a source electrode of the first MOSFET is connected to the gate electrode of the switching device, and wherein the plurality of field effect transistors included in the second gate resistance variable circuit are n-type second MOSFETs, each of a source electrode of the second MOSFET is connected to the second transistor, and each of a drain electrode of the second MOSFET is connected to the gate electrode of the switching device.

* * * * *